(12) United States Patent
Reinicker et al.

(10) Patent No.: US 10,597,773 B2
(45) Date of Patent: Mar. 24, 2020

(54) ANTIMONY-CONTAINING MATERIALS FOR ION IMPLANTATION

(71) Applicants: Aaron Reinicker, Buffalo, NY (US); Ashwini K Sinha, East Amherst, NY (US); Douglas C Heiderman, Akron, NY (US)

(72) Inventors: Aaron Reinicker, Buffalo, NY (US); Ashwini K Sinha, East Amherst, NY (US); Douglas C Heiderman, Akron, NY (US)

(73) Assignee: Praxair Technology, Inc., Danbury, CT (US)

( * ) Notice: Subject to any disclaimer, the term of this patent is extended or adjusted under 35 U.S.C. 154(b) by 32 days.

(21) Appl. No.: 16/106,197

(22) Filed: Aug. 21, 2018

(65) Prior Publication Data

US 2019/0062901 A1    Feb. 28, 2019

Related U.S. Application Data

(60) Provisional application No. 62/548,688, filed on Aug. 22, 2017.

(51) Int. Cl.
*C23C 14/48* (2006.01)
*H01J 37/08* (2006.01)
(Continued)

(52) U.S. Cl.
CPC .............. *C23C 14/48* (2013.01); *C23C 14/14* (2013.01); *H01J 37/08* (2013.01);
(Continued)

(58) Field of Classification Search
None
See application file for complete search history.

(56) References Cited

U.S. PATENT DOCUMENTS 4,588,609 A    5/1986 Leyden et al.
5,518,528 A    5/1996 Tom et al.
(Continued)

FOREIGN PATENT DOCUMENTS

CN    1076634 C    12/2001
CN    103728157 A    4/2014
(Continued)

OTHER PUBLICATIONS

Not Always Obvious to Optimize Claimed Variables; Oblon, Mar. 5, 2012—Blog Post; McClelland, Maier & Neustadt, L.L.P.—Intellectual Property Law Firm; https://www.oblon.com/news/not-always-obvious-to-optimize-claimed-variables.
(Continued)

*Primary Examiner* — Thien F Tran
(74) *Attorney, Agent, or Firm* — Nilay S. Dalal

(57) ABSTRACT

A novel method, composition and system for using antimony-containing dopant materials are provided. The composition is selected with sufficient vapor pressure to flow into an arc chamber as part of an ion implant process. The antimony-containing material is represented by a non-carbon containing chemical formula, thereby reducing or eliminating the introduction of carbon-based deposits into the ion chamber. The composition is stored in a storage and delivery vessel under stable conditions, which includes a moisture-free environment that does not contain trace amounts of moisture.

19 Claims, 4 Drawing Sheets

Schematic of beamline ion implant system

(51) Int. Cl.
*H01J 37/317* (2006.01)
*C23C 14/14* (2006.01)
*H01J 37/32* (2006.01)
*H01L 21/265* (2006.01)

(52) U.S. Cl.
CPC .... *H01J 37/3171* (2013.01); *H01J 37/32412* (2013.01); *H01L 21/26513* (2013.01); *H01J 2237/022* (2013.01); *H01J 2237/06* (2013.01); *H01L 21/265* (2013.01)

(56) References Cited

U.S. PATENT DOCUMENTS

| | | | |
|---|---|---|---|
| 5,937,895 | A | 8/1999 | Le Febre et al. |
| 6,005,127 | A | 12/1999 | Todd et al. |
| 6,007,609 | A | 12/1999 | Semerdjian et al. |
| 6,045,115 | A | 4/2000 | Martin, Jr. et al. |
| 6,204,180 | B1 | 3/2001 | Tom et al. |
| 6,319,565 | B1 | 11/2001 | Todd et al. |
| 7,708,028 | B2 | 5/2010 | Brown et al. |
| 7,905,247 | B2 | 3/2011 | Campeau |
| 9,165,773 | B2 | 10/2015 | Sinha et al. |
| 9,257,286 | B2 | 2/2016 | Heiderman et al. |
| 2005/0051096 | A1 | 3/2005 | Horsky et al. |
| 2005/0211923 | A1* | 9/2005 | Banks ............... H01J 27/08 250/492.21 |
| 2013/0334516 | A1 | 12/2013 | Weiss et al. |
| 2014/0084219 | A1 | 3/2014 | Zhao et al. |
| 2014/0322902 | A1* | 10/2014 | Sinha ............... H01J 27/02 438/514 |
| 2015/0056380 | A1* | 2/2015 | Savas ............... H01J 37/3171 427/523 |
| 2016/0258537 | A1 | 9/2016 | Heiderman et al. |
| 2016/0276155 | A1 | 9/2016 | Cameron et al. |

FOREIGN PATENT DOCUMENTS

| | | |
|---|---|---|
| EP | 3188214 A1 | 7/2017 |
| WO | 2016069516 A1 | 5/2016 |

OTHER PUBLICATIONS

G.M. Oleszek et al., Sb Implantation for Bipolar Buried Layers Using SbF5, in a Cold-Cathode Implantation System, Nuclear Instruments and Methods in Physics Research B6 (1985) pp. 389-393, North-Holland, Amsterdam, 0168-583X/85/$03.30 Elsevier Science Publishers B.V. (North-Holland Physics Publishing Division).

* cited by examiner

Schematic of beamline ion implant system

Schematic of plasma immersion ion implant system

US 10,597,773 B2

ANTIMONY-CONTAINING MATERIALS FOR ION IMPLANTATION

CROSS REFERENCE TO RELATED APPLICATION(S)

This application claims the benefit of provisional application Ser. No. 62/548,688, filed Aug. 22, 2017.

FIELD OF THE INVENTION

The present invention relates to novel antimony-containing materials for ion implantation and suitable conditions for storage and delivery of the materials for ion implant processes.

BACKGROUND OF THE INVENTION

Ion implantation is a critical process in semiconductor/microelectronic manufacturing. The ion implantation process is typically used in integrated circuit fabrication to introduce dopant impurities into semiconductor wafers. Generally speaking, with respect to semiconductor applications, ion implantation involves the introduction of ions from a dopant gas, also commonly referred to as dopant impurities, into a semiconductor wafer to alter the physical, chemical and/or electrical characteristics of the wafer in a desired manner. The desired dopant impurities are introduced into semiconductor wafers in trace amounts to form doped regions at a desired depth into the surface of the wafer. The dopant impurities are selected to bond with the semiconductor wafer to create electrical carriers and thereby alter the electrical conductivity of the semiconductor wafer. The concentration or dosage of dopant impurities introduced into the wafer determines the electrical conductivity of the doped region. In this manner, several impurity regions are created to form transistor structures, isolation structures and other electronic structures, which collectively function as a semiconductor device.

An ion source is used to generate an ion beam of ion species from a source dopant gas. The ion source is a critical component of the ion implantation system, which serves to ionize the dopant gas to produce certain dopant ions that are to be implanted during the implantation process. The ion source chamber comprises a cathode, such as a filament made of tungsten (W) or a tungsten alloy, which is heated to its thermionic generation temperature to generate electrons. The electrons accelerate towards the arc chamber wall and collide with the dopant source gas molecule in the arc chamber to generate a plasma. The plasma comprises dissociated ions, radicals, and neutral atoms and molecules of the dopant gas species. The ion species are extracted from the arc chamber and then separated from the other ionic species based on mass. Only ions in the beam based on a certain mass-to-charge ratio can pass through a filter. The selected mass of ions contains the desired ion species which is then directed towards the target substrate and implanted into the target substrate at the required depth and dosage.

Current semiconductor device technology utilizes a variety of dopant species in specific amounts to produce p-type and n-type semiconductors, both of which are considered building blocks for the manufacture of transistor and diode electronic devices. The difference in p-type and n-type dopants is primarily related to the charge carrying species introduced into the semiconductor crystal lattice. A p-type dopant is used to generate electron "holes" in the semiconductor material by creating electron deficiencies in the valence band while n-type dopants are used to generate free electrons in a semiconductor material. Antimony (Sb) is an example of a commonly used dopant species required for today's electronic devices. Sb is an n-type dopant with many desirable uses that continues to gain interest in the semiconductor industry. For example, Indium Antimonide is a narrow bandgap III-V semiconductor used as an infrared detector. Antimony is also used to form ultra-shallow p-n junctions in finFET devices; threshold voltage tuning of channels in MOSFETs; punch through stop halo implants in pMOS device; and source-drain regions in germanium n-MOSFETs.

Currently, solid sources of Sb are used as dopant materials. Elemental Sb metal can be used for ion implantation by placing it in close proximity to a filament. During ion implantation, the temperature of the filament is sufficiently high such that radiative heating causes Sb to evaporate and collide with electrons to create Sb-containing ions for doping. However, this method can cause Sb to deposit on the chamber walls or on the filament, shortening the filament lifetime. Solid compounds of Sb are also used as dopant sources, such as $SbF_3$, $SbCl_3$, and $Sb_2O_3$, but these compounds require heating to above 160° C. to generate a sufficient amount of vapor necessary for ion implantation. Additionally, all flow lines in the system are typically heated to prevent re-condensation of the solid sources of Sb before reaching the arc chamber.

Given the operational challenges of solid sources of Sb for implanting Sb-containing ions, gas sources of Sb have been contemplated. In particular, $SbH_3$ and $SbD_3$ have been proposed as gaseous sources of Sb, but these compounds are unstable and decompose at room temperature.

There is currently no viable Sb dopant source available today for ion implantation. There is an unmet need for a reliable Sb dopant source that can be used in traditional ion implantation systems.

SUMMARY OF THE INVENTION

The invention may include any of the following aspects in various combinations and may also include any other aspect described below in the written description or in the attached drawings.

The invention relates, in part, to a method and system for using antimony dopant compositions. The compositions of the Sb-containing materials utilized herein have been found to improve ease of delivery to an ion implant process and substantially reduce accumulation of Sb-containing deposits within the ion chamber.

In a first aspect, a composition suitable for ion implantation for implanting antimony-containing ions to create an n-type electronic device structure, comprising: an antimony-containing material, said antimony-containing material chemically stable at ambient temperature and maintained under storage conditions in a liquid phase under sub-atmospheric pressure and further wherein said storage conditions are characterized by the absence of trace amounts of moisture; said antimony-containing material represented by a non-carbon containing chemical formula; said antimony-containing material in the liquid phase being in substantial equilibrium with a corresponding vapor phase that is adapted to exert a sufficient vapor pressure in response to a downstream vacuum pressure condition.

In a second aspect, a sub-atmospheric storage and delivery vessel for a composition suitable for ion implantation for implanting antimony ions to create an n-type electronic device structure, comprising: an antimony-containing material, said antimony-containing material chemically stable at ambient temperature; said antimony-containing material represented by a non-carbon containing chemical formula; a storage and delivery vessel defined, at least in part, by a moisture-free environment that is characterized by the absence of trace amounts of moisture, said storage and delivery vessel configured for holding said antimony-containing material in a liquid phase under sub-atmospheric conditions, whereby said liquid phase is in substantial equilibrium with a corresponding vapor phase occupying a headspace of the storage and delivery vessel.

In a third aspect, a method of operating an ion source for implanting Sb-containing ions, comprising: introducing an antimony-containing material in a vapor phase at a flow rate of at least about 0.1 sccm or greater into an arc chamber; ionizing said composition to produce Sb-containing ions in the arc chamber; and implanting the Sb-containing ions into a substrate.

In a fourth aspect, an adsorbent comprising a deliverable adsorption capacity for sub-atmospheric storage and delivery for a composition suitable for ion implantation for implanting antimony ions to create an n-type electronic device structure, said composition comprising an antimony-containing material, said antimony-containing material chemically stable at ambient temperature; said antimony-containing material represented by a non-carbon containing chemical formula; and said adsorbent having a moisture-free environment having a moisture no greater than about 50 ppm.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

Figure 1:
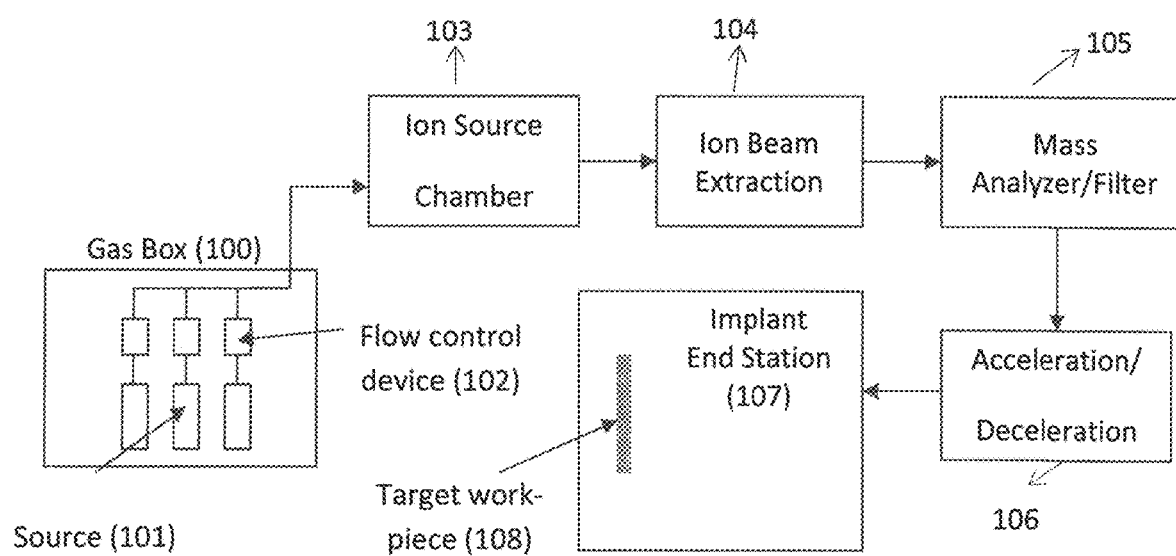
FIG. 1 shows a beamline ion implant system, incorporating the principles of the invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

The invention may include any of the following embodiments in various combinations and may also include any other aspect described below in the written description or in the attached drawings. As used herein, the term "embodiment" means an embodiment that serves to illustrate by way of example but not limitation.

As used herein and throughout, the term "Sb-containing ions" or "Sb ions" means various Sb ionic species, including Sb ions or Sb-containing ions such as $Sb^+$ or $Sb^{2+}$ and oligomer ions, such as, but not limited to, $Sb_2^+$ suitable for implantation into a substrate.

"Substrate" as used herein and throughout refers to any material, including, but not limited to, a wafer or other sliced or non-sliced material or similar target object requiring ion implantation, formed from any suitable material including, silicon, silicon dioxide, germanium, gallium arsenide and alloys thereof, into which another material, such as a dopant ion, is implanted.

It should be understood that "Sb" and "antimony" will be used interchangeably herein and throughout and are intended to have the same meaning. Reference to "Sb-containing material" or "Sb-containing source material" is intended to refer to a liquid phase of the inventive antimony material as well as the corresponding vapor phase with which the liquid phase is in substantial equilibrium. "Sb-containing liquid source material" is intended to mean the inventive material that is in substantial equilibrium with a corresponding vapor phase.

As used and throughout, the term "vessel" and "container" are used interchangeably and are intended to mean any type of storage, filling, transport and/or delivery vessel, including but not limited to, cylinders, dewars, bottles, tanks, barrels, bulk and microbulk, which are suitable for filling, storing, transporting, and/or delivery of materials.

As used herein and throughout, unless indicated otherwise, all concentrations are expressed as volumetric percentages ("vol %").

"Reduce", "reduced" or "reduction" as used herein and throughout is made in reference to an ion implant process and is intended to mean (i) shorten, suppress and/or delay the onset of a detrimental event or occurrence (e.g., reduced decomposition reactions; reduced ion shorting); or (ii) lowered in amount to unacceptable levels which are incapable of achieving a specific purpose (e.g., reduced flow incapable of sustaining plasma); or (iii) lowered to an insubstantial amount which does not negatively impact a specific purpose (e.g., reduced amount of oligomers which does not destabilize flow into arc chamber); or (iv) reduced by a significant amount in comparison to conventional practice but which does not alter the intended function (e.g., reduced heat tracing while still maintaining a vapor phase of material without re-condensation of said material along conduit).

As used herein and throughout, "about" or "approximately" when referring to a measurable value such as an amount or a temporal duration is meant to encompass variations of ±20%, ±10%, ±5%, ±1% and ±0.1% from the specified value, as such variations are appropriate.

Throughout this disclosure, various aspects of the invention can be presented in range format. It should be understood that the description in range format is merely for convenience and brevity and should not be considered as a limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

In view of the lack of a suitable Sb source material for ion implantation, the present invention has emerged. The disclosure in one aspect relates to a composition for antimony, suitable for ion implantation as a n-type dopant, comprising the following attributes: (i) an antimony containing material that can be stored in the liquid phase under sub-atmospheric conditions in which the storage conditions are a moisture free environment characterized by an absence of trace amounts of moisture, defined herein as no greater than about 50 ppm; (ii) the antimony-containing material represented by a non-carbon containing chemical formula; and (iii) the liquid phase of the antimony-containing material in substantial equilibrium with a corresponding vapor phase that can flow at a substantially continuous flow rate in the vapor phase in response to a downstream vacuum pressure condition.

The Sb-containing source material has a liquid phase in substantial equilibrium with a corresponding vapor phase under storage conditions. The material remains stable at ambient temperature, and does not have a tendency to decompose during ion implant use. The Sb-containing material as a liquid has an adequate vapor pressure, which is defined herein as an amount of vapor that can sustain a flow rate of about 0.1-100 sccm into the arc chamber. In particular, the flow rate of Sb-containing material in the vapor phase is adequate so as to generate and maintain a stable plasma during operation of the ion implanter. The stable plasma allows the implantation of Sb ions to occur at an arc voltage of about 50-150 V and an extraction voltage of about 1-300 keV across extraction electrodes, whereby a beam of Sb-containing ions is produced. The beam current of Sb-containing ions ranges from about 10 microamps to 100 mA, resulting in a Sb ion dosage into the substrate of about 1E11 to 1E16 atoms/cm$^2$.

In one aspect, the Sb-containing source material of the present invention is stored in a vessel in the liquid phase which is in substantial equilibrium with its vapor phase, which occupies the head space of the vessel. The vapor phase of the Sb-containing source material can be withdrawn from the vessel and delivered along a conduit into the arc chamber of ion implanter at ambient temperature conditions. Advantageously, and contrary to conventional Sb-containing materials, the Sb-containing source material in the liquid phase has an evaporation rate that can replenish the (i) head space of the vessel; as well as (ii) the conduit extending from the vessel to the arc chamber. In this manner, a sufficient amount of Sb-containing source material evaporates into the vapor phase to sustain a flow rate of about 0.1-100 sccm that flows into the arc chamber.

Applicants have discovered that maintaining an evaporation rate of the liquid Sb-containing source material to produce a vapor phase flow rate of at least about 0.1 sccm or greater along conduit and into the arc chamber is required. When the evaporation rate of the Sb-containing source liquid is or falls below a certain threshold such that the resultant flow rate of the Sb-containing source material in the vapor phase is or falls below about 0.1 sccm, the Sb-containing material in the vapor phase may be flowing along conduit and into the arc chamber at a faster rate than the rate of evaporation of the Sb-containing source material that is contained in the vessel. The flow into the arc chamber may not be sustainable, and eventually be reduced to unacceptably low levels or have a tendency to become erratic. Ultimately, in a worst case scenario, the flow may completely stop or be reduced to a degree where the ion beam becomes unstable and fails, such that the entire implantation process is required to be aborted.

In an alternative embodiment, and as one viable means to accelerate the rate of evaporation, the liquid source Sb-containing material may be stored in a storage and delivery vessel maintained under sub-atmospheric conditions to enable the liquid source material to evaporate at a relatively higher rate that is sufficient to form the required amount of source material into the vapor phase that is responsible for generating the required flow rate of about 0.1-100 sccm into the arc chamber. Accordingly, the liquid source Sb-containing material evaporates at a sufficient rate into the vapor phase to replenish the vapor in the headspace of the storage and delivery vessel and along the conduit extending into the arc chamber, thereby creating and maintaining a vapor phase flow rate of the Sb-containing source material between about 0.1-100 sccm during operation of the ion implanter for Sb ion implantation.

To enable the required storage conditions for evaporation to occur, the storage and delivery vessel is configured with sufficient head space into which a sufficient volume of vapor of the Sb containing source can reside to allow the requisite vapor phase flow into the conduit that extends to the arc chamber. Specifically, the storage and delivery vessel is configured to provide a volumetric ratio of liquid to head space of at least about 1:1, more preferably about 1:2 and most preferably about 1:3. Additionally, sufficient surface area of the Sb-containing liquid exposed to the vapor phase within the storage and delivery vessel is preferably available to allow for the requisite evaporation to replenish the head space of the storage and delivery vessel as the corresponding vapor phase of the Sb-containing material flows along the conduit to create a substantially stable flow of the Sb-containing vapor therealong and into the arc chamber. Specifically, the surface area of liquid exposed to the vapor phase is preferably at least about 16 cm$^2$, more preferably greater than or equal to about 50 cm$^2$ and most preferably greater than about 100 cm$^2$.

Other storage conditions for the Sb-containing source material may cause the evaporation rate of the liquid source material to be unacceptably low. For example, if the Sb-containing liquid source material is stored in a storage and delivery vessel at a pressure equal to or greater than atmospheric pressure, then the partial pressure of the a vapor phase of the liquid source material may be insufficient, as a result of air, N$_2$, or any other inert and/or reactive gas species that may have been inadvertently introduced into the head space of the storage and delivery vessel upon a filling operation. Additionally, in such a scenario, the contamination of the Sb-containing material in the vapor phase with other contaminants can render the material unsuitable for usage in the ion implantation process, which generally cannot tolerate the introduction of contaminants, including atmospheric contaminants, into the arc chamber.

In another embodiment, the present invention is directed to causing a vapor phase of Sb-containing material to flow from the vessel in the form of substantially monomers with elimination or reduction of the amount of oligomers so as to ensure vapor phase flow stability of Sb containing material into the arc chamber. For example, the storage and delivery vessel may be heated to no greater than 65 C, as one viable means for reducing the number of oligomers (e.g., dimers, trimers, tetramers, and/or pentamers) formed in the vapor phase, thereby forming a vapor phase of substantially monomers of Sb containing material. In another embodiment, the storage and delivery vessel may be heated to no greater than 50 C as a means to form a vapor phase of substantially monomers of Sb containing material. In yet another embodiment, the storage and delivery vessel may be heated to no greater than 40 C as a means to form a vapor phase of substantially monomers of Sb containing material. Applicants have recognized that under the same storage conditions, oligomers of Sb-containing material in the vapor phase can have a lower flow rate than that of Sb-containing material in the vapor phase of substantially monomers, resulting in unacceptable flow instability and variation. In this manner, the selection of certain sub-atmospheric pressure and elevated temperature conditions, in combination with vessel configuration suitable for sufficient evaporation as hereinbefore described can reduce the amount of oligomers in the vapor phase.

In another embodiment, the Sb-containing source material can be co-flowed or sequentially flowed with an inert gas, such as $N_2$, He, Ne, Ar, Kr, or Xe to improve the stability of the vapor phase flow rate of the Sb-containing source material into the arc chamber. Alternatively or in addition thereto, the inert gas may be configured to flow through the Sb containing source material in the liquid phase or interact with the storage and delivery vessel.

In another aspect, the Sb-containing source material is stored in a storage and delivery vessel that is a moisture free environment not containing trace amounts of moisture, which is defined herein and throughout as being no greater than about 50 ppm. In the presence of moisture, halogenated Sb-containing compounds can react to form $Sb_2O_3$, $H_2$, HF, or HCl. Such a moisture free environment not containing trace amounts of moisture can be achieved in the storage vessel by several techniques, one of which includes performing cycles of a so-called "freeze pump thaw". In one cycle of a freeze-pump-thaw, the Sb-containing source material is cooled such that all of the Sb-containing source material vapor condenses from the gas phase, while other contaminants such as moisture and air remain in the vapor phase. After allowing sufficient time for the Sb-containing source material to condense, the head space of the vessel is evacuated using a pump, while the vessel continues to be cooled such that substantially all of the vapor contaminants are removed and the Sb-containing material remains as a solid, liquid or mixture thereof in the vessel. When the contaminants have been removed, the vessel is enclosed and the Sb-containing material in the solid, liquid or mixture thereof is heated to ambient temperature to form a liquid that is in substantial equilibrium with its corresponding phase. In this manner, moisture and other impurities, especially atmospheric impurities, are avoided from being introduced into the storage and delivery vessel. Other techniques may be used for achieving a moisture free environment for the Sb-containing material, including but not limited to, fluorine passivation of the inner surfaces of the vessel. Alternatively, a plastic vessel may be employed for storing and delivering the Sb-containing material to the arc chamber for ion implantation.

The deleterious effects of carbon-based deposits during Sb ion implantation are preferably avoided by the present invention. The Sb-containing source material is a molecule represented by a non-carbon containing chemical formula to reduce or eliminate formation of carbon-based deposits in the arc chamber and throughout other regions of the ion source. Examples of carbon-based deposits include but are not limited to C, CF, and CCl compounds. The carbon-based deposits can reduce the ion source life by forming whiskers or other various shaped deposits along various components of the ion implanter, including the extraction plate, where carbon-based deposition can cause the distortion of the shape of the ion beam. Alternatively or in addition thereto, the carbon-based deposits can deposit and accumulate as residual particles onto the substrate. The presence of carbon in the plasma can also lower the beam current of Sb due to the formation of carbon-containing ions which become freely available for dilution of the plasma. Accordingly, the present invention preferably utilizes Sb-containing source materials represented by a non-carbon containing chemical formula. In this manner, the avoidance of carbon in the Sb-containing source material reduces or eliminates the introduction of carbon-derived deposits entering the arc chamber along with the associated deleterious effects.

In a preferred embodiment, antimony pentafluoride ($SbF_5$) is the Sb-containing source material for performing ion implantation. $SbF_5$ is a corrosive liquid that is a relatively strong lewis acid and can react violently with moisture to produce $Sb_2O_3$ and HF. As such, the SbF5 source material is stored in a storage and delivery vessel under sub-atmospheric conditions in a moisture free environment that does not contain trace amounts of moisture, which is defined herein and throughout as being no greater than about 50 ppm. $SbF_5$ is maintained as a liquid at about 25 Celsius with a vapor pressure of about 10 Torr in a storage and delivery vessel that is operably connected to an arc chamber.

Other source materials are contemplated. For example, in another embodiment of the present invention, $SbCl_5$ is an antimony-containing source material suitable for ion implantation. $SbCl_5$ is maintained as a liquid at about 25 Celsius with a vapor pressure of 7.6 Torr in a storage delivery vessel that is operably connected to an arc chamber. Other source materials in accordance with the applicable criteria of the present invention may also be used as described herein.

Notwithstanding the stability of $SbF_5$ and the process benefits of using a liquid based material for Sb ion implantation, the inventors have recognized that one of the design challenges of utilizing SbF5 and other fluorine containing Sb compounds is that the presence of fluorine in the compound may lead to an excess of fluorine ions in the plasma. The fluorine ions can propagate a so-called "halogen cycle" in which halogen ions in excess can cause etching of tungsten chamber walls onto the cathode producing tungsten fluoride species, generally represented by WFx, which can migrate onto the hot ion source filament where it can deposit tungsten. The deposition of tungsten has a tendency to increase the operating voltage of the ion source which in turn increases the deposition of W onto the ion source filament, until the ion source may eventually degrade. This halogen cycle has a tendency to reduce the lifetime of the ion source.

To mitigate the effects of the halogen cycle, hydrogen containing compounds can be incorporated during use of either SbF5 or other Sb-containing source materials contemplated by the present invention, particularly those containing fluorine atoms or other halogens. The hydrogen containing compounds can be introduced into the arc chamber in any possible manner, including by sequentially flowing or co-flowing the hydrogen containing compounds with the SbF5 or with the other Sb-containing source materials of the present invention. Alternatively, the hydrogen containing compounds can be stored as a mixture with the SbF5 or the other Sb-containing source materials contemplated by the present invention. Suitable hydrogen containing compounds include, but are not limited to, $H_2$, $CH_3F$, $CH_2F_2$, $Si_2H_6$, $PH_3$, $AsH_3$, $SiH_4$, $GeH_4$, $B_2H_6$, $CH_4$, $NH_3$, or $H_2S$ and any combination thereof.

The amount of hydrogen-containing compound introduced into the arc chamber to mitigate the halogen cycle should be in an effective amount that is capable of neutralizing or scavenging the deleterious effects of fluorine or other halogens that may be contained in the Sb-containing source materials of the present invention. When SbF5 is utilized, the effective amount of hydrogen-containing compound is preferably at least about 20 vol % of the overall composition of SbF5 and the hydrogen-containing compound to provide an adequate amount of hydrogen atoms to mitigate the deleterious effects of the halogen cycle. The term "effective amount" as used herein and throughout means the required amount of a particular material, such as hydrogen-containing compounds, to achieve the stated goal, such as neutralizing or scavenging the deleterious effects of fluorine or other halogen ions that may be present as a result of the halogen cycle, or otherwise, during a specific recipe for ion implantation of Sb ionic species. In one example, the vol % of the hydrogen-containing compound needed to mitigate the halogen cycle can be approximately 50 vol % of the resultant compositional mixture of the SbF5 and the hydrogen-containing compound formed in the arc chamber. It should be understood that the effective amount of the hydrogen containing compound can be greater than about 50 vol % of the total composition of SbF5 and the hydrogen-containing compound.

The avoidance of solid Sb-containing sources in the present invention by using the contemplated liquid source materials of the present invention that meet the applicable criteria as defined herein includes several process benefits. For example, excessive heating, as typically required to adequately volatize solid Sb-containing sources and prevent its condensation and deposition along conduit and flows lines of the ion implant system is reduced or entirely avoided when employing the Sb-containing source materials of the present invention. At minimum, conventional Sb-containing solid sources require that the conduit extending between the storage and delivery vessel and the arc chamber be heated to prevent condensation of Sb-containing solid sources which are vaporized but which may be susceptible to condensation during the ion implantation. On the contrary, the present invention reduces the amount of or eliminates the need to heat trace the conduit. The present invention also reduces or eliminates the risk of the inventive Sb-containing material from depositing and accumulating onto the chamber walls and/or the ion source filament. The avoidance of such excessive temperatures also reduces or eliminates tendencies for decomposition and side reactions that can make the Sb ion implant process difficult to control.

Additionally, the need for higher temperatures with other Sb sources, particularly Sb-containing solid sources, restricts the use of control valves, thereby making flow control difficult. In the present invention, the avoidance of elevated temperatures allows the use of control valves to control vapor flow at the desired flow rates mentioned herein to allow stable and controlled operation of the ion implanter. In one embodiment, the controlled flow rate in the present invention allows the implanter to operate at a beam current of at least about 10 microamps for a ion source life of at least about 50 hours while incurring a glitch rate of less than about 1 glitch/min.

Still further, the present invention reduces or eliminates the need for a carrier or reactive gas. On the contrary, carrier or reactive gases have been previously implemented when, by way of example, a solid Sb-containing source is plated onto a surface in close proximity to the arc chamber thereby requiring heating of the surface to elevated temperatures to vaporize the solid Sb-containing source. The carrier or reactive gas then directs the vaporized Sb-containing source into the arc chamber.

With reference to FIG. 1, an exemplary beam line ion implantation apparatus in accordance with the principles of the invention is shown. Beam line ion-implant systems are used to perform ion implant processes. The components of a beam line ion plant system are shown in FIG. 1. A Sb-containing liquid source material 101 is selected in accordance with the principles of the present invention so as to have adequate vapor pressure. The Sb-containing source material 101 is stored in a storage and delivery vessel located within a gas box 100 as shown in FIG. 1. The Sb-containing liquid source material 101 is stored in a moisture free environment that does not contain trace amounts of moisture, defined herein as no greater than about 50 ppm. The Sb-containing liquid source material 101 is further represented by a non-carbon containing formula. In a preferred embodiment, the Sb-containing liquid source material 101 is SbF5. Alternatively, the Sb-containing liquid source material 101 is SbCl5. One or more hydrogen-containing compounds may be optionally included in a gas box 100 and flowed into the arc chamber 103 in an effective amount to mitigate the effects of the halogen cycle when a Sb-containing material including a halogen (e.g., SbF5 or SbCl5) is utilized.

The Sb-containing liquid source material 101 is stored in a liquid phase that is in substantial equilibrium with a corresponding vapor phase occupying the head space of the storage and delivery vessel. The vapor pressure of the Sb-containing source material 101 is sufficient to reduce or eliminate the amount of heating of the lines between the gas box 100 and the ion source chamber 103, thereby enabling control stability of the process as described hereinbefore. The vapor phase of the Sb-containing liquid material 101 is configured to flow at a substantially continuous and adequate flow rate in the vapor phase in response to a vacuum pressure condition downstream of the gas box 100. The vapor exits headspace of the storage and delivery vessel and flows into conduit and then flows therealong towards the ion source chamber 103. The vapor pressure of the Sb-containing source material within the storage and delivery vessel in gas box 100 is sufficient to allow stable flow of the vapor phase of the Sb-containing source material along conduit and into the arc chamber 103. The vapor phase of the Sb-containing liquid material 101 is introduced into an ion source chamber 103 where the ionization of the material 101 occurs. Energy is introduced into the chamber 103 to ionize the Sb-containing vapor. Flow control device 102, which can include one or more mass flow controllers and corresponding valves, is used to control the flow rate of the vapor at a predetermined value. The excessive temperatures, as is typically required with conventional solid-containing Sb sources, are avoided with the process of FIG. 1, thereby allowing the use of control valves to control vapor flow at the desired flow rates mentioned herein to allow stable and controlled operation of the ion implanter. The ionization of the Sb-containing material may create various antimony ions. An ion beam extraction system 104 is used to extract the antimony ions from the ion source chamber 103 in the form of an ion beam of desired energy. Extraction can be carried out by applying a high voltage across extraction electrodes. The beam is transported through a mass analyzer/filter 105 to select the Sb ionic species to be implanted. The ion beam can then be accelerated/decelerated 106 and transported to the surface of the target workpiece 108 (i.e., substrate) positioned in an end station 107 for implantation of the Sb ions into the workpiece 108. The workpiece may be, for example, a semiconductor wafer or similar target object requiring ion implantation. The Sb ions of the beam collide with and penetrate into the surface of the workpiece at a specific depth to form a doped region with the desired electrical and physical properties.

Figure 2:
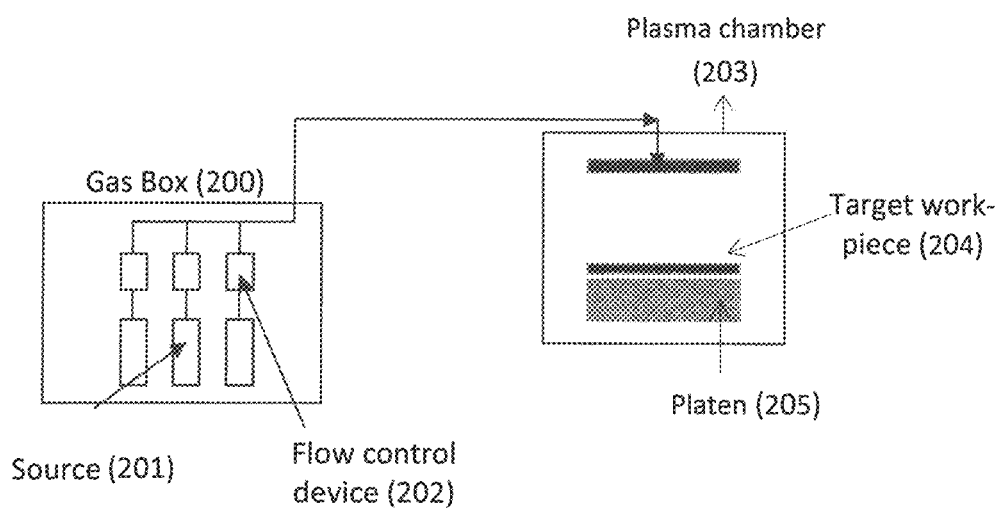
FIG. 2 shows a plasma immersion ion implant system, incorporating the principles of the present invention.

It should be understood that the novel Sb-containing material of the present invention can be utilized with other ion implant systems. For example, a Plasma immersion ion implant (PIII) system as shown in FIG. 2 may also be utilized to implant Sb ions. Such a system includes a gas box 200, which is similar in configuration to the beam line ion implantation apparatus 100. Operation of the PIII system is similar to that of the beam line ion implant system of FIG. 1. Referring to FIG. 2, the vapor phase of the Sb-containing liquid source material of the present invention is introduced from the source 201 into the plasma chamber 203 by a flow control device 202. Source 201 represents a storage and delivery vessel that is configured to store a liquid phase of Sb-containing material in substantial equilibrium with a corresponding vapor phase occupying a headspace of the storage and delivery vessel. Sb-containing liquid source material 201 is stored in a moisture free environment that does not contain trace amounts of moisture, defined herein as no greater than about 50 ppm. The Sb-containing liquid source material 101 is further represented by a non-carbon containing formula. In a preferred embodiment, the Sb-containing source material 101 is $SbF_5$. Alternatively, the Sb-containing source material 101 is $SbCl_5$.

The vapor pressure of the Sb-containing source material 201 is sufficient to reduce or eliminate the amount of heating of the lines between the gas box 200 and the plasma chamber 203, thereby enabling control stability of the process as described hereinbefore. The vapor phase of the Sb-containing liquid source material 201 is configured to flow at a substantially continuous and adequate flow rate in the vapor phase in response to a vacuum pressure condition downstream of the gas box 200. The vapor phase exits headspace of the storage and delivery vessel and flows into conduit and then flows therealong towards the plasma chamber 203. The vapor pressure of the Sb-containing source material within the storage and delivery vessel in gas box 200 is sufficient to allow stable flow of the vapor phase of the Sb-containing source material along conduit and into the arc chamber 203. As the vapor phase of the Sb-containing liquid material is introduced into an ion source chamber 203, energy is subsequently provided to ionize the Sb-containing vapor and produce Sb ions. The Sb ions present in the plasma are accelerated towards the target work piece 204. It should be understood that one or more hydrogen-containing compounds may be optionally included in gas box 200 and flowed into the plasma chamber 203 in an effective amount to mitigate the effects of the halogen cycle when a Sb-containing material including a halogen (e.g., $SbF_5$ or $SbCl_5$) is utilized.

Figure 3:
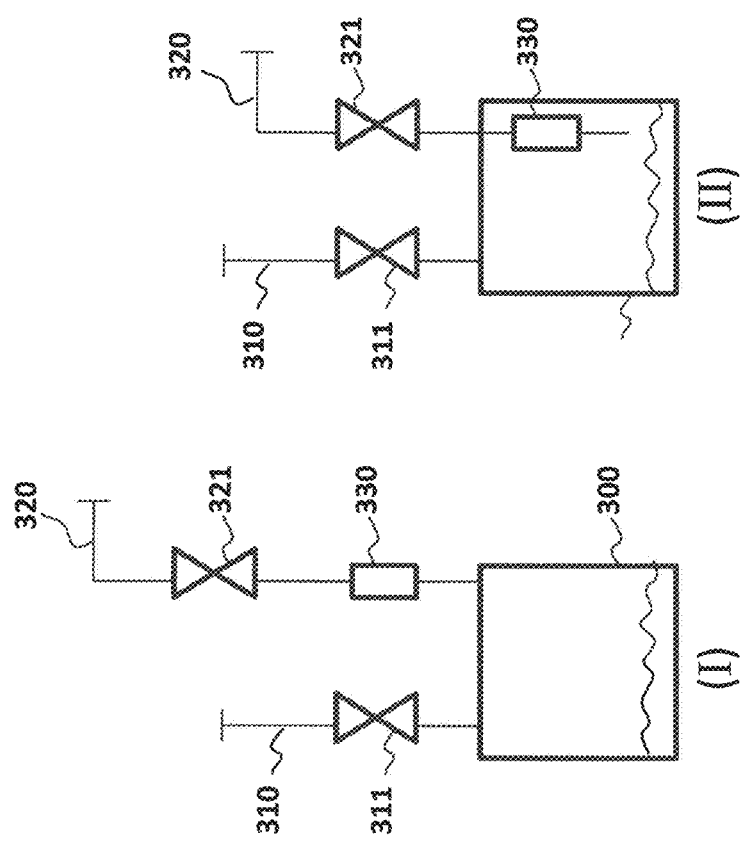
FIG. 3 shows an exemplary storage and delivery vessel, incorporating the principles of the present invention.

In another aspect of the present invention, a storage and delivery vessel for the Sb-containing source material disclosed herein is provided as shown in FIG. 3. The storage and delivery vessel allows for safe packaging and delivery of the inventive Sb-containing source material. The Sb-containing source material of the present invention is contained within vessel 300. The vessel 300 is equipped with an inlet port 310 to allow filling of vessel 300 with the desired Sb-containing source material. The port can also be used to purge the interior of vessel 300 with inert gas and evacuate vessel 300 before filling with the desired Sb dopant material. In one example, cycles of freeze pump thaw can be conducted utilizing vessel 300 to create a moisture free environment that does not contain trace amounts of moisture no greater than about 50 ppm.

An outlet port 320 is provided to withdraw a vapor phase of the Sb-containing material from the headspace of vessel 300. A vacuum actuated check valve 330 is provided upstream of outlet port that dispenses a controlled flow rate of the Sb-containing material in response to sub-atmospheric conditions occurring downstream of the cylinder 300. This vacuum actuated check valve 330 enhances the safety while handling the various Sb-containing materials of the present invention. When valve 321 is open to atmospheric pressure, check valve 330 prevents introduction of any air or other contaminants inside vessel 300, and hence mitigates both the risk of contamination and the reduction of the partial pressure of Sb-containing material in the vapor phase occupying the head space of vessel 300. In this manner, high purity levels of the Sb-containing materials can be maintained during storage, delivery and use thereof in a safe manner whereby the withdrawn vapor phase of the Sb-containing source material can maintain adequate vapor pressure to create the required flow rate during ion implantation. The check valve 330 can be situated outside vessel 300 (Case I). Alternatively, the check valve 330 can be situated inside vessel 300 (Case II). The vessel 300 is in fluid communication with a discharge flow path, wherein the check valve 330 is actuated to allow a controlled flow of the Sb-containing source material from the interior volume of the vessel 300 in response to a sub-atmospheric condition achieved along the discharge flow path.

The vessel 300 may be a cylinder for holding the Sb-containing material in at least partial vapor phase under sub-atmospheric conditions. The Sb-containing material is stored at sub-atmospheric conditions therewithin. The Sb-containing material remains chemically stable and does not undergo decomposition within the interior of the cylinder 300. The Sb-containing material is preferably stored as a liquid at ambient temperature (20-25° C.). In one embodiment, the vapor pressure is greater than about 1 Torr. In another embodiment, the vapor pressure is greater than 3 about Torr, and more preferably greater than about 5 Torr.

Figure 4:
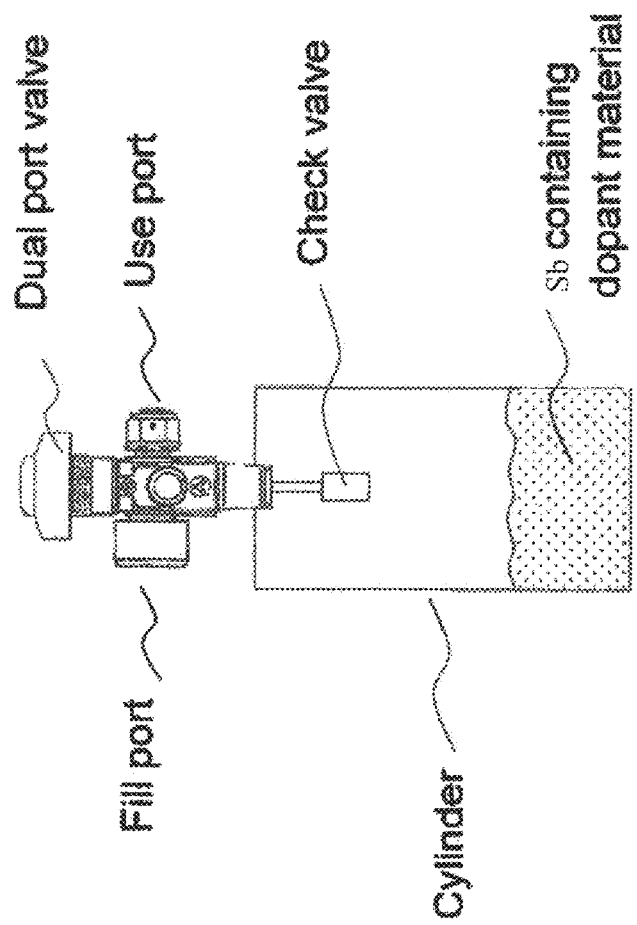
FIG. 4 shows an alternative storage and delivery vessel incorporating the principles of the present invention.

The cylinder 300 preferably includes a dual port valve assembly in mechanical communication with the cylinder 300. The dual port valve is shown in FIG. 4 and comprises a fill port valve and a discharge port valve, wherein the fill port valve is in fluid communication with an interior of the cylinder to introduce the Sb-containing dopant material therein. The discharge port valve is in fluid communication with a flow discharge path extending from the interior to the exterior of the cylinder to discharge the antimony-containing dopant material therefrom. The check valve 330 is located along the flow discharge path, whereby the check valve is configured to move from a closed position to an open position in response to a sub-atmospheric condition external to the cylinder.

Other storage vessels are contemplated. For example, in an alternative embodiment, the antimony-containing dopant material may be stored and dispensed from an adsorbent-based delivery system. Various suitable adsorbents are contemplated, including but not limited to a carbon-based absorbent or a metal-organic framework.

In yet another embodiment, the UpTime® delivery device, commercially available by Praxair (Danbury, Conn.) and as disclosed in U.S. Pat. Nos. 5,937,895; 6,045,115; 6,007,609; 7,708,028; and 7,905,247 and U.S. Patent Publication No. 2016/0258537 all of which are incorporated herein by reference in their entirety, may be employed in the present invention to safely deliver a controlled flow rate of the vapor phase of the Sb-containing source material from vessel 300 to an ion apparatus for Sb ion implantation. The vacuum-actuated check valve of the UpTime® delivery device serves to prevent contamination of air and other gases at atmospheric pressure which may be present in the surrounding environment from infiltrating into the vessel and contaminating the Sb-containing precursor material and reducing its partial pressure.

Other suitable sub-atmospheric delivery devices may include pressure regulators, check valves, excess flow valves and restrictive flow orifices in various arrangements. For example, two pressure regulators may be disposed in series within the cylinder to down regulate the cylinder pressure of the Sb-containing source material in the vapor phase within the vessel to a predetermined pressure acceptable for downstream mass flow controllers contained along the fluid discharge line.

The vessel or cylinder 300 along with the contemplated variations thereof may be configured in combination with a beamline ion implant system (FIG. 1), whereby the vessel or cylinder 300 is operably connected to said system by a network of flow lines or conduit extending there between. Advantageously, the conduit is preferably characterized by elimination or a reduced amount of heat tracing in comparison to conventional Sb-containing sources.

Alternatively, the vessel or cylinder 300 along with the contemplated variations thereof may be configured in combination with a plasma immersion system (FIG. 2), whereby the vessel or cylinder 300 is operably connected to said plasma immersion system by a network of flow lines or conduit extending there between. Advantageously, the conduit is preferably characterized by elimination or a reduced amount of heat tracing in comparison to conventional Sb-containing sources.

Numerous benefits of the present invention are contemplated. For example, the utilization of liquid-based Sb-containing precursors of the present invention for delivery of the Sb-containing vapor phase for Sb ion implantation, followed by switching to a different gaseous dopant source generally requires less time as compared to utilizing solid-based Sb-containing precursors for Sb ion implantation and then utilizing a different gaseous dopant source. Specifically, compared to solid Sb-containing sources, the utilization of liquid-based Sb-containing precursors of the present invention for delivery of the Sb-containing vapor phase reduces the start-up time required to switch to different dopant species for ion implantation, thereby resulting in a greater wafer throughput for the implanter. As an example, an implanter running solid Arsenic (As) or solid Phosphorus (P) as a source material for implantation of their respective ionic species can be expected to require about 30 minutes to tune the ion beam while the use of gaseous $AsH_3$ or gaseous $PH_3$ source materials generally can be expected to require only about 4 minutes to tune its ion beam. The term "tuning" or "tune" as used herein and throughout means the process of producing a beam of only the target ion species with a specific beam current and size. In comparison, with regards to solid Sb-containing source materials, mass flow into the arc chamber is controlled by the vaporizer temperature required for sublimation in which the Sb-containing source is stored to ensure the solid source is sufficiently heated into a vapor phase prior to delivery to the arc chamber. When taking into consideration the time to heat the solid Sb-containing source material to its vapor phase, tune the beam and subsequently cool down the solid Sb-containing source upon completion of the ion implantation process, a total time of about 30-90 minutes to switch to another dopant species can occur, whereas delivery of a gaseous dopant source derived from the Sb-containing liquid precursors can require a duration of about 5-10 minutes. The net result can be significant increase in throughput with the present invention.

Additionally, the liquid-based Sb-containing precursors of the present invention can be placed in the same gas box (e.g., as shown in FIGS. 1 and 2) as other dopant sources without requiring additional heating. In contrast, Sb-containing solid sources require a separate vaporizer positioned along the conduit that is extending to the arc chamber for purposes of ensuring the Sb-containing vapor does not re-condense, which necessitates more space than may be available, and, further, which adds complexity and expense to the ion implantation process.

As can be seen, the present invention provides a viable solution for conventional Sb-containing sources for ion implantation, including Sb-containing solid sources which are difficult to deliver consistently into arc chambers due to their low vapor pressure and limited thermal stability.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A composition suitable for ion implantation for implanting antimony-containing ions to create an n-type electronic device structure, comprising:
    an antimony-containing material, said antimony-containing material chemically stable at ambient temperature and maintained under storage conditions in a liquid phase under sub-atmospheric pressure and further wherein said storage conditions are characterized by the absence of trace amounts of moisture;
    said antimony-containing material represented by a non-carbon containing chemical formula; and
    said antimony-containing material in the liquid phase being in substantial equilibrium with a corresponding vapor phase that is adapted to exert a sufficient vapor pressure in response to a downstream vacuum pressure condition.

2. The composition of claim 1, further comprising a hydrogen-containing compound, and further wherein the hydrogen-containing compound is in an effective amount to mitigate a halogen cycle.

3. The composition of claim 1, wherein said antimony-containing material is SbF5.

4. The composition of claim 1, wherein said antimony-containing material comprises no greater than about 50 ppm moisture.

5. The composition of claim 1, wherein said antimony-containing material is SbF5, said SbF5 maintained as a liquid at about 25 Celsius with a vapor pressure of about 10 Torr.

6. A sub-atmospheric storage and delivery vessel for a composition suitable for ion implantation for implanting antimony ions to create an n-type electronic device structure, comprising:
    an antimony-containing material, said antimony-containing material chemically stable at ambient temperature;
    said antimony-containing material represented by a non-carbon containing chemical formula;
    a storage and delivery vessel defined, at least in part, by a moisture-free environment that is characterized by the absence of trace amounts of moisture, said storage and delivery vessel configured for holding said antimony-containing material in a liquid phase under sub-atmospheric conditions, whereby said liquid phase is in substantial equilibrium with a corresponding vapor phase occupying a headspace of the storage and delivery vessel.

7. The sub-atmospheric storage and delivery vessel of claim 6, further comprising a dual port valve assembly in mechanical communication with the storage and delivery vessel, the dual port valve comprising a fill port valve and a discharge port valve, wherein the fill port valve is in fluid communication with an interior of the storage and delivery vessel to introduce the antimony-containing material therein, and the discharge port valve is in fluid communication with a flow discharge path extending from the interior to the exterior of the storage and delivery vessel to discharge the corresponding vapor phase of the antimony-containing material therefrom.

8. The sub-atmospheric storage and delivery vessel of claim 6, wherein said antimony-containing material is stored as a liquid at about 20-25 C having a vapor pressure no greater than about 760 Torr.

9. The sub-atmospheric storage and delivery vessel of claim 6, further comprising a check valve along the flow discharge path, and further wherein said storage and delivery vessel is configured to dispense said corresponding vapor phase of the antimony-containing material from the headspace of the storage and delivery vessel in response to a downstream pressure of about 760 Torr or less.

10. The sub-atmospheric storage and delivery vessel of claim 6, further comprising a hydrogen-containing compound that is mixed with the antimony-containing material as a part of a single source supply, or is stored in a separate vessel as part of a kit.

11. A method of operating an ion source for implanting Sb-containing ions, comprising:
introducing an antimony-containing material in a vapor phase at a flow rate of at least about 0.1 sccm or greater into an arc chamber;
ionizing said antimony-containing material to produce Sb-containing ions in the arc chamber; and
implanting the Sb-containing ions into a substrate;
wherein a glitch rate is no greater than about 1 glitch per min for an ion source life about 50 hours.

12. The method of claim 11, further comprising introducing an effective amount of a hydrogen-containing compound into the arc chamber.

13. The method of claim 11, wherein said antimony-containing material as stored in the vapor phase is provided to the arc chamber in the absence of heating the vapor phase.

14. The method of claim 11, further comprising maintaining an evaporation rate of the antimony-containing material to produce the vapor phase at the flow rate of at least about 0.1 sccm or greater during the method of operating the ion source.

15. The method of claim 11, further comprising maintaining a temperature of the antimony-containing material in the vapor phase to not exceed about 65 Celsius.

16. The method of claim 11, further comprising operating the ion source at an arc voltage between about 50 to 150 V.

17. An ion source apparatus configured to perform antimony-containing ion implantation at an arc voltage less than about 150 V, said ion source adapted to receive at least about 0.1 sccm of an antimony-containing material in a vapor phase, said antimony-containing material chemically stable at ambient temperature and maintained under storage conditions in a liquid phase under sub-atmospheric pressure and further wherein said storage conditions are characterized by the absence of trace amounts of moisture;
said antimony-containing material represented by a non-carbon containing chemical formula; and
said antimony-containing material in the liquid phase being in substantial equilibrium with a corresponding vapor phase that is adapted to exert a sufficient vapor pressure in response to a downstream vacuum pressure condition.

18. The ion source apparatus of claim 17, further comprising an average glitch rate of no greater than about 1 glitch per minute during a source life of at least about 50 hours.

19. An adsorbent comprising a deliverable adsorption capacity for sub-atmospheric storage and delivery for a composition suitable for ion implantation for implanting antimony ions to create an n-type electronic device structure, said composition comprising an antimony-containing material, said antimony-containing material chemically stable at ambient temperature;
said antimony-containing material represented by a non-carbon containing chemical formula; and
said adsorbent having a moisture-free environment having a moisture no greater than about 50 ppm.

* * * * *